United States Patent [19]

Rallapalli

[11] Patent Number: 5,063,539
[45] Date of Patent: Nov. 5, 1991

[54] FERROELECTRIC MEMORY WITH DIODE ISOLATION

[75] Inventor: Krishna Rallapalli, San Jose, Calif.

[73] Assignee: Raytheon Company, Lexington, Mass.

[21] Appl. No.: 593,528

[22] Filed: Oct. 5, 1990

Related U.S. Application Data

[63] Continuation of Ser. No. 265,384, Oct. 31, 1988, abandoned.

[51] Int. Cl.$^5$ .............................................. G11C 11/22
[52] U.S. Cl. .................................... 365/145; 365/175; 365/230.06
[58] Field of Search ........... 365/145, 175, 190, 230.06; 357/23.5

[56] References Cited

U.S. PATENT DOCUMENTS

| | | | |
|---|---|---|---|
| 2,876,436 | 3/1959 | Anderson | 365/145 |
| 2,918,655 | 12/1959 | Pulvari | 365/145 |
| 3,196,405 | 7/1965 | Gunn | 365/149 |
| 3,260,996 | 7/1966 | Müller | 365/145 |
| 3,355,723 | 11/1967 | Clark | 365/149 |
| 3,585,611 | 6/1971 | Lefkowitz et al. | |
| 3,728,694 | 4/1973 | Rohrer | |
| 3,911,464 | 10/1975 | Chang et al. | 357/23.5 |
| 3,939,292 | 2/1976 | Rohrer | 427/55 |
| 3,990,057 | 11/1976 | Kumada | 365/145 |
| 4,068,217 | 1/1978 | Arnett et al. | 365/182 |
| 4,099,237 | 7/1978 | Mikada et al. | 364/710 |
| 4,161,038 | 7/1979 | Wu | 365/145 |
| 4,169,258 | 9/1979 | Tannas, Jr. | 365/145 |
| 4,195,355 | 3/1980 | Rohrer | 365/145 |
| 4,488,262 | 12/1984 | Basire et al. | 365/104 |
| 4,707,897 | 11/1987 | Rohrer et al. | 29/25.42 |
| 4,713,157 | 12/1987 | McMillan et al. | 204/192.11 |
| 4,809,225 | 2/1989 | Dimmler et al. | 365/145 |
| 4,873,664 | 10/1989 | Eaton, Jr. | 365/145 |

OTHER PUBLICATIONS

"The Research Status and Device Potential of Ferroelectric Thin Films"; M. H. Francombe; PA; 1971.
"Ferroelectric Radiation-Hardness for NonVolatile Memory Applications" Krysalis Corp. Technical Rpt.; 11/87; Albuquerque, NM.
"NonVolatile Ferroelectric Technology & Products"; Ramtron Inter. Technical Rpt.; 10/87; Colorado.

Primary Examiner—Glenn Gossage
Attorney, Agent, or Firm—Edmund J. Walsh; Richard M. Sharkansky

[57] ABSTRACT

An improved ferroelectric, non-volatile memory comprises an array of ferroelectric capacitors with each capacitor connected to one row and one column select line through a network of diodes. The select lines are connected to a power supply or ground to access one of the cells. The diodes are configured to provide a conducting path between a power supply and ground including the accessed cell while isolating all other cells from the power supply and ground.

11 Claims, 2 Drawing Sheets

FERROELECTRIC MEMORY WITH DIODE ISOLATION

This application is a continuation of application Ser. No. 265,384 filed Oct. 31, 1988, now abandoned.

BACKGROUND OF THE INVENTION

The invention relates generally to semiconductor memories and more particularly to non-volatile ferro electric memories.

Semiconductor memories are widely used in many digital systems. These memories generally contain an array of memory cells fabricated on a semiconductor substrate. A plurality of row select lines, and a plurality of column select lines are connected to the memory cells. One memory cell is connected at the intersection of each row select line and each column select line.

By applying a signal to one row select line and one column select line, the memory cell at the intersection of those lines can be accessed. An access may consist of "reading" or "writing" to the memory cell. Each memory cell is constructed to store one bit of information, and the binary value of the bit stored in a cell can be altered during a write operation or placed on an output line during a read operation.

Many memory cells are constructed such that power must be continuously applied in order for the cell to maintain the stored information. In some systems, however, it is important for information to be retained even when power to the system is turned off. In those systems, non-volatile memory cells are used.

Ferroelectric materials have been used for non-volatile memory cells. For example, U.S. Pat. Nos. 4,713,157 issued in the name of McMillan et al., and 4,707,897 issued in the name of Rohrer et al., disclose ferroelectric semiconductor memories. As is known, ferroelectric materials become polarized when they are placed in a sufficiently strong electric field. Importantly for use in non-volatile memories, ferroelectrics maintain this polarization when removed from the electric field. In fact, an ideal ferroelectric maintains the polarization until placed in a sufficiently strong electric field of the opposite polarity.

When used in memory cells, the ferroelectric material is formed into a structure which operates as a capacitor. The "capacitor" is connected between the row and column select lines. An electric field through the ferroelectric material in a memory cell is created by a voltage applied across the select lines which access that memory cell. A positive voltage exceeding a particular value, called the coercive threshold voltage, polarizes the ferroelectric in a positive direction. A negative voltage exceeding the coercive threshold voltage polarizes the ferroelectric material in the negative direction. To store a bit having a logic "1" in the cell, a positive voltage is applied. To store a bit having a logic "0", a negative voltage is applied.

To read out the information in a cell, a positive voltage exceeding the coercive threshold voltage is applied and the current flow into the cell is measured. When the cell has a negative polarization and a positive voltage is applied, the polarization changes. A substantial displacement current flows into the cell. Thus, a large current flow during the read indicates a logic 0 stored in the cell. Conversely, a very small current flow during the read operation indicates a logic 1.

After the positive voltage is applied to read the cell, the cell stores a logic 1 regardless of what value was stored before the reading (i.e. a destructive read out). Thus, each time a cell is read out, the value stored in the memory must be detected and written into the memory cell. Ferroelectric memories, therefore, contain control logic which restores the value read from the cell back into the cell after the read operation.

Since semiconductor memories contain numerous cells, voltages must only be applied across the selected cell during a read or write operation. When no cells are being accessed, all the select lines are at the reference potential. To access a cell joining a particular row and a particular column select line, a positive voltage equal to one-half the coercive threshold voltage is applied to one select line and a negative voltage also equal to one-half of the coercive threshold voltage is applied to the other select line. A voltage equal to the coercive threshold voltage is thus applied across the selected cell. The polarity of the applied voltage is determined by whether the positive or negative voltage is applied to the row or column select line.

The maximum voltage which develops across any cell other than the selected cell is one-half the coercive threshold voltage. For an ideal ferroelectric material, such a voltage should have no effect because a voltage exceeding the coercive threshold voltage must be applied to change the polarization of the ferroelectric material. In real ferroelectrics, however, such an applied voltage causes what is known as a "half select phenomenon". The polarization of the cells exposed to even one-half the coercive threshold voltage gradually changes. These gradual changes in polarization may disrupt information stored in the memory in an unpredictable manner and are thus undesirable.

An additional drawback of existing ferroelectric semiconductor memories is that both a positive and negative voltage source are required. Having both polarity voltage sources requires components which can handle both polarities to drive the select lines. CMOS devices are symmetrical and can handle both polarities of voltage and are generally used. In some cases, however, it would be desirable to use bipolar devices which do not easily handle both polarities of voltage.

SUMMARY OF THE INVENTION

It is an object of this invention to provide a ferroelectric memory structure which does not exhibit the half selected phenomenon.

It is also an object of this invention to provide a ferroelectric memory structure which requires only one polarity voltage source.

It is yet another object of this invention to provide a ferroelectric memory structure requiring only components fabricated in bipolar technologies.

The foregoing and other objects of this invention are achieved by an array of ferroelectric memory cells wherein each row and each column select line comprises two lines: a first control line switchably coupled to ground through a bipolar transistor; and a second control line connected to a positive voltage source which can be switchably grounded through a bipolar transistor. A first side of each ferroelectric memory cell is connected to the first control line of the colum control bus via a diode having its anode coupled to the cell and to the second control line of the column select line via a diode having its cathode coupled to the cell. A second side of each ferroelectric memory cell is connected to the first control line of the row select line via a diode having its anode coupled to the cell and to the second control line of the row select line bus via a diode having its cathode coupled to the cell.

BRIEF DESCRIPTION OF THE DRAWINGS

With the foregoing background in mind, the invention will be better understood by reference to the following more detailed description and the accompanying drawings in which.

DESCRIPTION OF THE PREFERRED EMBODIMENTS

Figure 1:
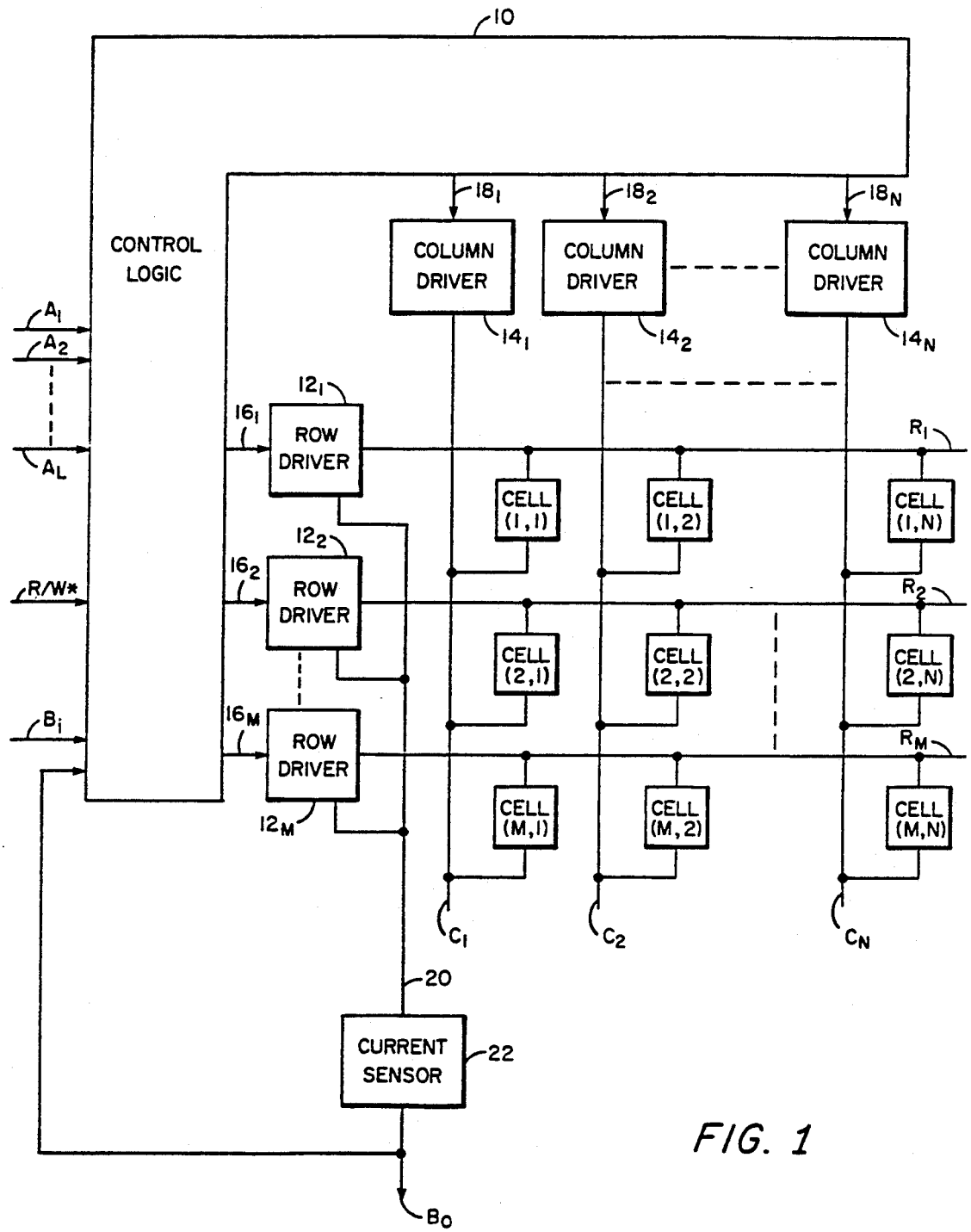
FIG. 1 is a block diagram of a ferroelectric semiconductor memory constructed according to the present invention.

FIG. 1 is a block diagram of a semiconductor memory fabricated according to the present invention. One skilled in the art will understand that the memory is fabricated on a semiconductor substrate according to well known processes. The block diagram does not show standard elements of semiconductor circuits such as power and ground connections, and standard elements of memory circuits, such as latches and buffers, but it is understood that such elements are required.

The memory contains a plurality of row select lines $R_1 \ldots R_M$ and a plurality of column select lines $C_1 \ldots C_N$. Memory cells $(1, 1) \ldots (M, N)$, described in greater detail below, are connected between the select lines. Row drivers $12_1 \ldots 12_M$ and column drivers $14_1 \ldots 14_N$, described in greater detail below, couple signals onto the select lines $R_1 \ldots R_M$ and $C_1 \ldots R_M$ to access a selected one of the memory cells $(1, 1)...(M, N)$. Row drivers $12_1 \ldots 12_M$ and column drivers $14_1 \ldots 14_N$ in turn receive control signals $16_1 \ldots 16_M$ and $18_1 \ldots 18_N$, respectively, from control logic 10.

Control logic 10 consists of known logic elements to respond to input signals and generate the control signals $16_1 \ldots 16_M$ and $18_1 \ldots 18_N$. Address inputs $A_1 \ldots A_L$ represent the particular one of the memory cells $(1, 1) \ldots (M, N)$ to be accessed. Control logic 10 decodes the address inputs $A_1 \ldots A_L$ to determine in which row and in which column the selected one of the memory cells $(1, 1) \ldots (M, N)$ resides. Control logic 10 then sets the value of the control signals $16_1 \ldots 16_M$ and $18_1 \ldots 18_N$ corresponding to that row and column.

The values of the control signals produced by control logic 10 also depend on the inputs R/W* and $B_i$. When input R/W* has a value of logic 1, control logic 10 sets the values of control signals $16_1 \ldots 16_M$ and $18_1 \ldots 18_N$ to store the value of input $B_i$ into the accessed one of the cells $(1, 1) \ldots (M, N)$. Conversely, when input R/W* has a value of logic 0, the value stored in the accessed one of the cells $(1, 1) \ldots (M, N)$ is read and appears at output $B_o$.

The memory of FIG. 1 performs a destructive read. To perform a read operation, control logic 10 first generates values of control signals $16_1 \ldots 16_M$ and $18_1 \ldots 18_N$ to write a logic 1 into the accessed one of the memory cells $(1, 1) \ldots (M, N)$. If the accessed cell stored a logic 0, a measurable current flows in line 20. Current sensor 22 measures the current flow in line 20 and produces a value on output line $B_o$ indicating a logic 0 when a current is detected and a logic 1 when no current is detected.

To prevent the information in the accessed memory cell from being lost during a read operation, control logic 10 next generates values of control signals $16_1 \ldots 16_M$ and $18_1 \ldots 18_N$ to write the value of $B_o$ back into the accessed cell.

Figure 2:
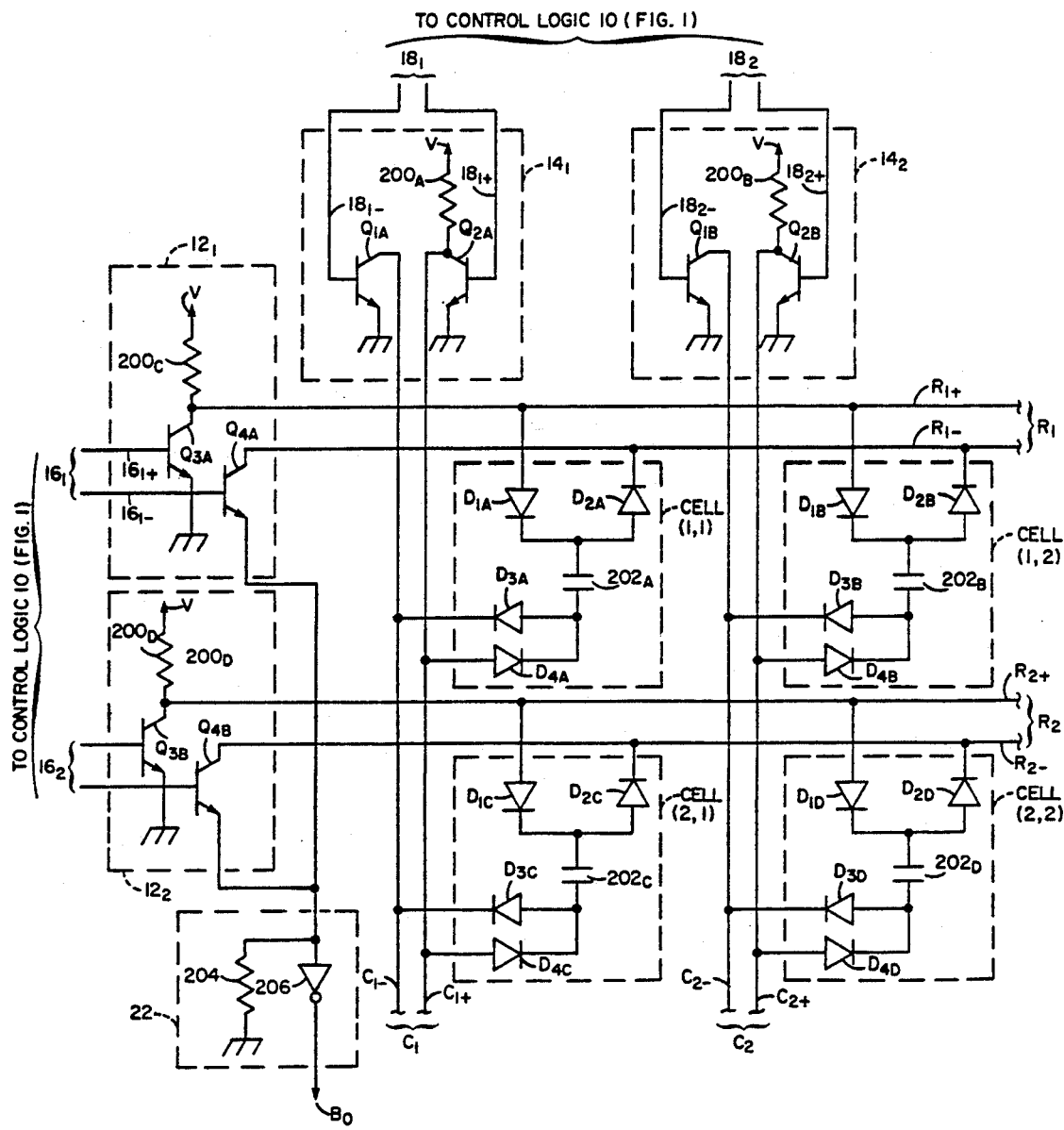
FIG. 2 is a schematic, greatly simplified, of exemplary ones of the memory cells, control buses, column drivers and row drivers of the semiconductor memory of FIG. 1.

Turning now to FIG. 2, additional details of the memory of FIG. 1 may be seen. Details of memory cells $(1, 1)$, $(1, 2)$, $(2, 1)$ and $(2, 2)$ are shown as exemplary of memory cells $(1, 1) \ldots (M, N)$; details of row driver $12_1$ and $12_2$ are shown as exemplary of the row drivers $12_1 \ldots 12_M$; and details of column drivers $14_1$ and $14_2$ are shown as exemplary of the column drivers $14_1 \ldots 14_N$. Select lines $R_1$, $R_2$, $C_1$ and $C_2$ are also shown to comprise two control lines each, $R_{1+}$ and $R_{1-}$, $R_{2+}$ and $R_{2-}$, and $C_{1+}$ and $C_{1-}$, respectively.

Considering memory cell $(1, 1)$ as illustrative, memory cell $(1, 1)$ comprises ferroelectric capacitor $202_A$. Capacitor $202_A$ is formed using known techniques. For example, U.S. Pat. No. 4,713,157 issued to McMillan et al. describes a method of forming two conductive layers with a layer of ferroelectric material in between. The conductive layers form the plates of capacitor $202_A$ and the ferroelectric material forms the dielectric.

Diodes $D_{1A} \ldots D_{4A}$ connect the plates of capacitor $202_A$ to control buses $R_1$ and $C_1$. Diodes $D_{1A} \ldots D_{4A}$ are formed, also using known techniques, in a semiconductor substrate (not shown). The diodes are oriented so that signals on both select lines $R_1$ and $C_1$ are required to access memory cell $(1, 1)$.

Row driver $12_1$ and column driver $14_1$, which produce the required control signals on select lines $R_1$ and $C_1$, each consist of two transistors, $Q_{3A}$ and $Q_{4A}$ and $Q_{1A}$ and $Q_{2A}$, respectively. Transistors $Q_{1A}$, $Q_{2A}$, $Q_{3A}$ and $Q_{4A}$ switch in response to control signals $18_{1-}$, $18_{1+}$, $16_{1+}$ and $16_{1-}$, respectively. For simplicity, each transistor can be thought of as an open circuit when a logic low voltage is applied to its corresponding control line and as a short circuit when a logic high voltage is applied to its corresponding control line. The values of control signals $16_{1+}$, $16_{1-}$, $18_{1+}$ and $18_{1-}$ are set by control logic 10 (FIG. 1) to access the individual memory cells $(1, 1) \ldots (M, N)$.

In quiescent operation, i.e. when memory cell $(1, 1)$ is not being accessed, control signals $16_{1-}$ and $18_{1-}$ are at a logic low voltage and control signals $16_{1+}$ and $18_{1+}$ are at a logic high voltage. Control lines $R_{1-}$ and $C_{1-}$ are thus floating, i.e. they are disconnected from ground. Control lines $R_{1+}$ and $C_{1+}$ are connected to ground. A little thought reveals that no voltage is applied across capacitor $202_A$ in the quiescent state.

To store a logic 0 in memory cell $(1, 1)$, control signal $16_{1+}$ is placed at a logic low voltage and control signal $18_{1-}$ is placed at a logic high voltage. Control line $R_{1+}$ is thus connected to the power supply V through resistor $200_C$. Here, resistor $200_C$ is selected to have a value small enough that the voltage dropped across the resistor is relatively small. Control line $C_-$ is connected to ground through transistor $Q_{1A}$. Diodes $D_{1A}$ and $D_{3A}$ are therefore forward biased. A voltage approximately equal to the power supply V voltage is therefore developed across capacitor $202_A$. Provided the power supply voltage V exceeds the coercive threshold voltage, the ferroelectric material in capacitor $202_A$ is polarized in a negative direction.

It is important to note that capacitors in other memory cells, such as capacitors $202_B$, $202_C$ and $202_D$ are not affected because no conducting path exists incorporating those capacitors. No current can flow to the capacitors and no voltage is applied across them. For example, even though control line $R_{1+}$ is at the power supply V voltage, no voltage develops across capacitor $202_B$. Control line $C_{2-}$ is floating because control signal $18_{2-}$ is a logic low. Because control line $C_{2+}$ is at ground, diode $D_{4B}$ is reverse biased. Thus, no path for current flows through capacitor $202_B$ and no voltage is developed across it. Thus, when capacitor $202_A$ is polarized, no voltage is applied across any other capacitor.

To maintain the stored level, the control signals $18_{1-}$ and $16_{1+}$ are returned to the quiescent condition. The polarization of capacitor 202A is thereby maintained.

To store a logic 1 in memory cell (1, 1) or to read the value stored in the cell, control signal $18_{1+}$ is placed & at a logic low voltage and control signal $16_{1-}$ is placed at a logic high voltage. Control line $C_{1+}$ is connected to the power supply V through resistor $200_A$ and control line $R_{1-}$ is connected to ground through transistor $Q_{4A}$. Here, the value of resistor $200_A$ is selected to be small enough so that a relatively small voltage is dropped r across the resistor $200_A$. The value of resistor 204 is also selected to be small enough so that a relatively small voltage is dropped across the resistor 204. A conducting path exists through diodes $D_{4A}$ and $D_{2A}$. A voltage having a magnitude approximately equal to the power supply V voltage is developed across capacitor $202_A$. The polarity of the voltage is opposite the polarity developed when a logic 0 is stored in memory cell (1, 1). The cell is thus positively polarized, which represents storage of a logic 1.

In storing a logic 1 in cell (1, 1) or reading the value stored in cell (1, 1), the conducting path between the power supply V and ground includes resistor 204. If the cell contains a logic "0", then a change in the polarization of the ferroelectric material in capacitor $202_A$ occurs, and a displacement current flows through resistor 204. Therefore, a voltage is developed across resistor 204 when a logic 1 is written into a memory cell where the cell had previously stored a logic 0. The voltage across resistor 204, if read while a logic 1 is being written to a cell, indicates the value stored in the cell. Amplifier 206 has as its input the value of the voltage across resistor 204. The output of amplifier 206 is the output $B_o$.

One bit of information can be stored in any of the other memory cells (1, 2)...(M, N) in a similar fashion. For example, cell (1, 2) is accessed via control signals $16_{1+}$, $16_{1-}$, $18_{2+}$, and $18_{2-}$. Control signal $18_{2+}$ is controlled in the same manner as control signal $18_{1+}$ was described above to be controlled to access cell (1, 1). Control signal $18_{2-}$ is controlled as control signal $18_{1-}$ was described above to be controlled to access cell (1, 1).

Having described one embodiment of the invention, other embodiments will become apparent to one of skill in the art. For example, the semiconductor memory could be augmented to store a plurality of bits for each address. In another embodiment, current sensor 22 could be formed from a transconductance amplifier in place of resistor 204. In another embodiment, CMOS or FETs could be used in place of bipolar junction transistors for driving the select lines instead of the bipolar junction transistors used in the disclosed embodiments. It is felt, therefore, that the scope of the invention should be limited only by the appended claims.

What is claimed is:

1. An improved memory comprising:
   (a) a first row control line and a second row control line;
   (b) a first column control line and a second column control line;
   (c) a ferroelectric capacitor having a first terminal and a second terminal, wherein:
      (i) said first terminal is connected to the first row control line via a first diode having its cathode coupled to the first terminal;
      (ii) said first terminal is connected to the second row control line via a second diode having its anode coupled to the first terminal;
      (iii) said second terminal is coupled to the second column control line via a third diode having its anode coupled to the second terminal; and
      (iv) said second terminal is coupled to the first column control line via a fourth diode having its cathode coupled to the second terminal.

2. The improved memory of claim 1, wherein said memory is fabricated on a semiconductor substrate.

3. The improved memory of claim 1 further comprising:
   (a) a column driver comprising:
      (i) a first transistor connecting the first column control line to ground in response to a first column control signal having a first value;
      (ii) a resistor connecting the first column control line to a power supply; and
      (iii) a second transistor connecting the second column control line to ground in response to a second column control signal having a first value; and
   (b) a row driver comprising:
      (i) a resistor connecting the first row control line to the power supply;
      (ii) a third transistor for connecting the first row control line to ground in response to a first row control signal having a first value;
      (iii) a fourth transistor for coupling the second row control line to ground in response to a second row control signal having a first value.

4. The improved memory cell in claim 3 further comprising logic means for producing the row and column control signals to:
   (a) polarize the ferroelectric capacitor to a first state, when:
      (i) the first column control signal does not have the first value; and
      (ii) the second row control signal has the first value; and
   (b) polarize the ferroelectric capacitor to a second state, when:
      (i) the first row control signal does not have the first value; and
      (ii) the second column control signal has the first value.

5. The improved memory of claim 1, wherein the memory is fabricated on a semiconductor substrate.

6. The improved memory of claim 4 further comprising means for measuring the current flow in the second row control line.

7. An improved memory comprising:
   (a) a first plurality of cells, each of such cells having a first terminal and a second terminal and comprising ferroelectric material coupled between the first and second terminals, the ferroelectric material having a coercive threshold voltage;

(b) a second plurality of cells, each of such cells having a first terminal and a second terminal and comprising ferroelectric material coupled between the first and second terminals, the ferroelectric material having a coercive threshold voltage;

(c) means for applying a voltage exceeding the coercive threshold across a selected one of the plurality of cells while applying substantially no voltage across all of the others of the plurality of cells, said means comprising:

(i) means for switchably coupling one circuit node to a reference voltage and for switchably coupling a second circuit node to a voltage positive with respect to the reference voltage;

(ii) a first plurality of diodes, each diode coupling the first terminal of a respective one of the first plurality of cells to the first circuit node;

(iii) a second plurality of diodes, each diode coupling the first terminal of a respective one of the first plurality of cells to the second circuit node;

(iv) means for switchably coupling a third circuit node to the reference voltage and for switchably coupling a fourth circuit node to a voltage positive with respect to the reference voltage;

(v) a third plurality of diodes, each coupling a respective one of the second terminals of the second plurality of cells to the third circuit node; and (vi) a fourth plurality of diodes, each coupling a respective one of the second terminals of the second plurality of cells to the fourth circuit node.

8. The improved memory of claim 7 wherein each of the means for switchably coupling includes a transistor.

9. The improved memory of claim 7 wherein each diode has a first terminal and a second terminal, one of such terminals being an anode and one of such terminals being a cathode, and the first terminal of each of the diodes in the first plurality of diodes is coupled to the first terminal of a corresponding cell and the second terminal of each of the diodes in the second plurality of diodes is coupled to the first terminal of a corresponding cell.

10. The improved memory of claim 9 wherein the second plurality of cells contains only one cell also in the first plurality of cells.

11. The improved memory of claim 10 wherein each of the means for switchably coupling comprises a transistor.

* * * * *